(12) United States Patent
Luo et al.

(10) Patent No.: US 6,456,163 B1
(45) Date of Patent: Sep. 24, 2002

(54) HIGH-FREQUENCY AMPLIFIER CIRCUIT HAVING A DIRECTLY-CONNECTED BIAS CIRCUIT

(75) Inventors: Sifen Luo, Hartsdale; Tirdad Sowlati, Ossining, both of NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/801,623

(22) Filed: Mar. 8, 2001

(51) Int. Cl.$^7$ ................................................ H03F 3/04
(52) U.S. Cl. ...................... 330/288; 330/296; 330/302
(58) Field of Search ............................. 330/288, 296, 330/302

(56) References Cited

U.S. PATENT DOCUMENTS

| | | | |
|---|---|---|---|
| 4,092,613 A | 5/1978 | Boubouleix | 330/289 |
| 4,230,999 A * | 10/1980 | Ahmed | 330/288 |
| 5,548,248 A | 8/1996 | Wang | 330/288 |
| 5,670,912 A | 9/1997 | Zocher | 330/296 |
| 5,798,665 A | 8/1998 | Ichihara | 327/317 |
| 5,828,269 A | 10/1998 | Wong et al. | 330/275 |
| 5,909,147 A | 6/1999 | Wyatt | 330/306 |
| 6,043,714 A | 3/2000 | Yamamoto et al. | 330/296 |
| 6,121,841 A * | 9/2000 | Sakuno | 330/302 |
| 6,326,849 B1 * | 12/2001 | Wang et al. | 330/302 |
| 6,333,677 B1 * | 12/2001 | Dening | 330/296 |

* cited by examiner

*Primary Examiner*—Michael B Shingleton
(74) *Attorney, Agent, or Firm*—Steven R. Biren

(57) ABSTRACT

A high-frequency amplifier circuit includes an amplifying transistor and a bias circuit directly connected to said amplifying transistor. The bias circuit includes a bias transistor having a control terminal and an inductor coupled to the control terminal, and the bias transistor also has an output terminal directly connected to the amplifying transistor. A resistor is connected in series with the inductor, and the series-connected components are connected in the circuit between the control terminal and a power supply terminal. By providing an inductor in the amplifier in this manner, loading effects on the amplifying transistor at high frequencies is substantially reduced.

3 Claims, 1 Drawing Sheet

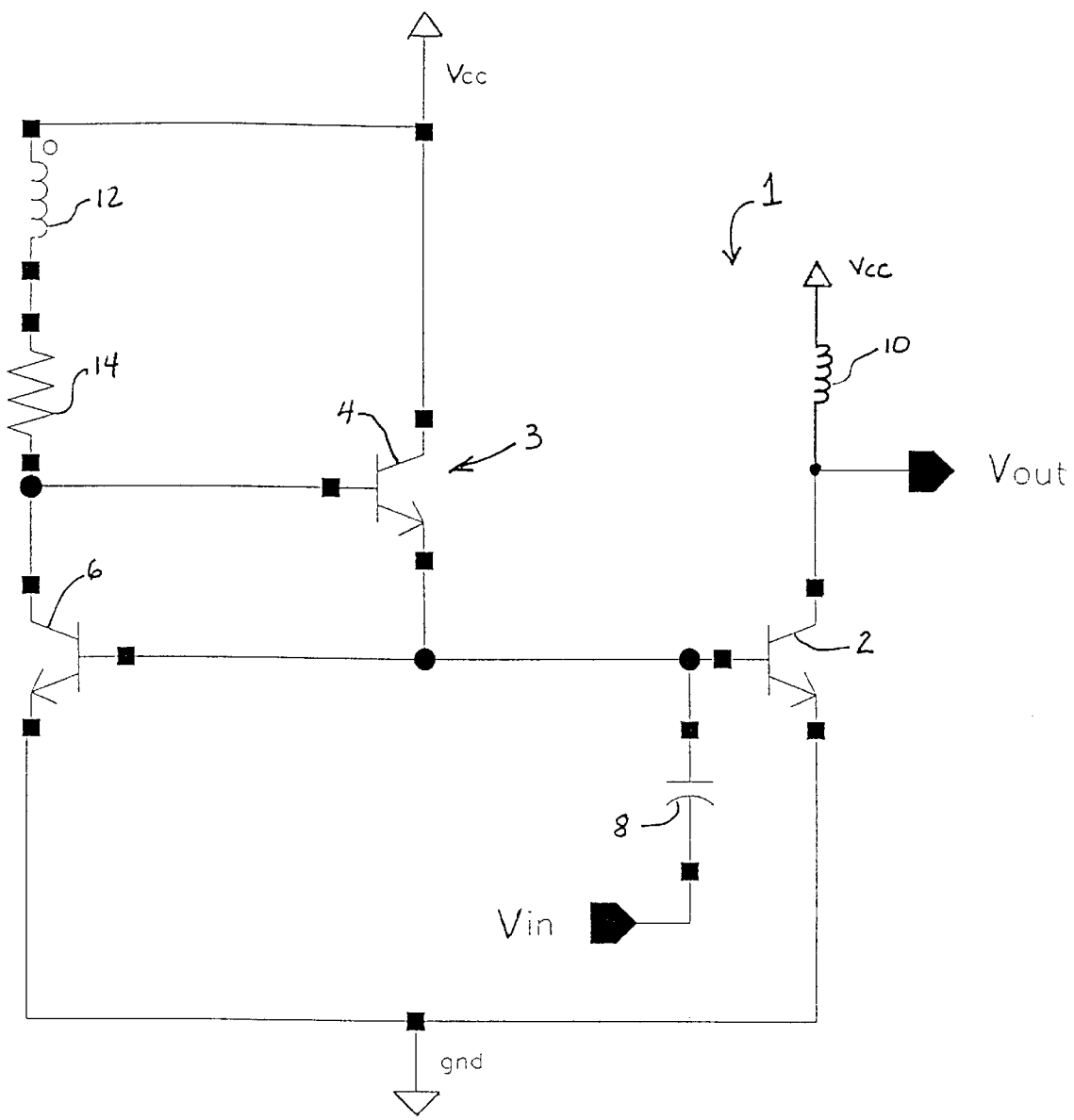

HIGH-FREQUENCY AMPLIFIER CIRCUIT HAVING A DIRECTLY-CONNECTED BIAS CIRCUIT

FIELD OF THE INVENTION

The invention is in the field of transistor amplifier circuits, and relates more particularly to high-frequency amplifier circuits and bias circuits for such amplifier circuits.

BACKGROUND OF THE INVENTION

In high-frequency amplifier circuits, the output stage is typically a bipolar transistor connected in a common-emitter configuration, biased with either a voltage source or a current source providing a bias signal at the base of the output stage transistor.

In IC technology, a straightforward way of biasing the output stage is to use a current-mirror circuit where the output stage is part of the current-mirror circuit. The quiescent DC current in the output stage can be directly controlled by a constant current in the current-mirror circuit. Typically, the bias of the amplifying transistor is provided by the current-mirror circuit through a resistor. However, the use of a resistor results in an increase in power loss in the circuit. This loss may be quite significant when a large current flows through the resistor.

In order to reduce or eliminate this loss and provide RF isolation between the amplifying transistor and the biasing circuit, it has been suggested to use an inductor instead of a resistor to couple the bias circuit to the base of the RF amplifier transistor, as shown for example in U.S. Pat. No. 6,043,714. However, this is not a complete solution to the problem, since parasitic resistance from the inductor can still cause a power loss and furthermore, it may cause a mismatch between the transistor pair in the current-mirror circuit due to the parasitic resistance. In some IC amplifier designs, these problems can be reduced by employing an external inductor, having a lower parasitic resistance than that of an on-chip inductor, but with many circuits this will require two bonding pads for external connection. This is relatively undesirable, since bonding pads are always at a premium in IC design.

Accordingly, it would be desirable to have a high-frequency amplifier circuit in which a bias circuit is employed which minimizes mismatch, minimizes power loss, and permits an external component connection, if required, to be done with only a single bonding pad.

SUMMARY OF THE INVENTION

It is therefore an object of the invention to provide a high-frequency amplifier circuit in which a bias circuit is provided which minimizes mismatch, minimizes power loss due to parasitic resistance in an inductor, and permits an external component to be connected with only a single bonding pad.

In accordance with the invention, these objects are achieved by a new high-frequency amplifier circuit which includes an amplifying transistor and a bias circuit directly connected to the amplifying transistor. The bias circuit includes a bias transistor having a control terminal and an inductor coupled to the control terminal, with the bias transistor also having an output terminal directly connected to the amplifying transistor.

In a preferred embodiment of the invention, a resistor is connected in series with the inductor coupled to the control terminal of the bias transistor, and the resistor and inductor are coupled between the control terminal and a power supply terminal.

In a further preferred embodiment of the invention, an additional transistor is provided having a control terminal connected to the output terminal of the bias transistor and an output terminal connected to the control terminal of the bias transistor.

High-frequency amplifier circuits in accordance with the present invention offer a significant improvement in that mismatch effects and power losses due to parasitic resistance are minimized and the connection of an external component such as an inductor is simplified.

These and other aspects of the invention will be apparent from and elucidated with reference to the embodiments to be described hereinafter.

BRIEF DESCRIPTION OF THE DRAWING

The invention may be more completely understood with reference to the following description, to be read in conjunction with the accompanying drawing, in which the single FIGURE shows a simplified schematic diagram of a high-frequency amplifier circuit in accordance with the invention.

DESCRIPTION OF THE PREFERRED EMBODIMENTS

A simplified schematic diagram of a high-frequency amplifier circuit 1 is shown in the single Figure of the drawing. The amplifier circuit 1 includes an amplifying transistor 2 and a bias circuit 3 having a bias transistor 4 which has its emitter directly connected to the base of the amplifying transistor 2. The bias circuit 3 also includes an additional transistor 6 having its collector connected to the base of transistor 4 and its base connected to the emitter of transistor 4. In the illustrative embodiment shown, transistor 6 is configured in a common-emitter mode and transistor 4 is configured in an emitter-follower mode of operation.

An RF signal to be amplified is provided at terminal Vin through a coupling capacitor 8 to the base of transistor 2, and an amplified output signal is taken from the collector of transistor 2 at terminal Vout, which is also coupled to a power supply terminal Vcc through an inductor 10. The bias circuit 3 and amplifying transistor 2 are both coupled between the power supply terminal Vcc and a common terminal, shown here as a ground terminal gnd.

In accordance with the invention, an inductor 12, here connected in series with a resistor 14, is coupled between Vcc and the base of bias transistor 4, with the output of the bias circuit being directly connected to the amplifying transistor by a direct connection between the emitter of transistor 4 and the base of transistor 2.

In the prior art, bias circuits are typically coupled to the amplifying transistor by either a resistor or an inductor. However, these techniques can give rise to a number of disadvantages, including nonlinearity, mismatch, power loss, and the necessity for two extra bonding pads when an off-chip inductor is used. In accordance with the present invention, these problems are reduced or eliminated by directly connecting the bias circuit to the amplifying transistor, and providing the inductor 12 in series with the resistor 14 at a portion of the bias circuit remote from its connection to the amplifying transistor. In this configuration, the inductor 12 will have substantially no effect on the DC characteristics of the circuit, but will effectively reduce or eliminate the RF loading effect of resistor 14 on the amplifying transistor 2, a problem that would otherwise be particularly severe in circuits operating with a low power supply voltage. Operational advantages of the disclosed circuit include a more constant gain over a wider output range and improved linearity, advantages that are particularly important in applications such as wireless digital communication circuits.

Computer simulation results on a PCS-CDMA linear power amplifier indicate that the provision of inductor 12 can result in an improvement in ACPR (Adjacent Channel Power Ratio) of about 8 dB with the power amplifier starting to saturate later when the inductor is provided.

It should be noted that the inductor 12 can be provided on-chip or off-chip. If the inductor is provided off-chip, the invention offers the additional advantage of requiring less chip area and one less bonding pad, because only one internal bonding pad is required since one side of the inductor can be connected to Vcc outside the chip.

In this manner, the present invention provides a power amplifier circuit with a bias circuit which reduces or eliminates mismatch problems, power losses, external component connection complexity and performance degradation due to loading effects of prior-art bias circuits. These features translate into the performance advantages of a more constant gain over a wider output range and improved linearity in power amplifier applications such as wireless digital communications.

While the invention has been particularly shown and described with reference to a preferred embodiment thereof, it will be understood by those skilled in the art that various changes in form and detail may be made without departing from the spirit and scope of the invention. Thus, for example, different types of transistors, bias circuits, and amplifying transistor circuits may be employed as appropriate, and alternations to the circuit configuration may be made to suit particular design requirements.

What is claimed is:

1. A high-frequency amplifier circuit comprising an amplifying transistor and a bias circuit directly connected to said amplifying transistor, said bias circuit comprising a bias transistor having a control terminal and an inductor coupled to said control terminal, and said bias transistor having an output terminal directly connected to said amplifying transistor, said circuit further comprising a resistor connected in series with said inductor, and said resistor and inductor being coupled between said control terminal and a power supply terminal.

2. A high-frequency amplifier circuit as in claim 1, further comprising an additional transistor having a control terminal connected to said output terminal of the bias transistor and an output terminal connected to said control terminal of the bias transistor.

3. A high-frequency amplifier circuit as in claim 2, wherein said transistors are bipolar transistors.

* * * * *